US006449369B1

(12) United States Patent
Carme et al.

(10) Patent No.: US 6,449,369 B1
(45) Date of Patent: Sep. 10, 2002

(54) METHOD AND DEVICE FOR HYBRID ACTIVE ATTENUATION OF VIBRATION, PARTICULARLY OF MECHANICAL, ACOUSTIC OR SIMILAR VIBRATION

(75) Inventors: Christian Carme, Marseille (FR); Andre Preumont, Chastre (BE)

(73) Assignee: Technofirst, Aubagne (FR)

( * ) Notice: Subject to any disclaimer, the term of this patent is extended or adjusted under 35 U.S.C. 154(b) by 0 days.

(21) Appl. No.: 09/043,822

(22) PCT Filed: Sep. 27, 1996

(86) PCT No.: PCT/FR96/01512

§ 371 (c)(1), (2), (4) Date: May 13, 1998

(87) PCT Pub. No.: WO97/12359

PCT Pub. Date: Apr. 3, 1997

(30) Foreign Application Priority Data

Sep. 27, 1995 (FR) ............................................ 95 11327

(51) Int. Cl.[7] ................................................ H03B 29/00

(52) U.S. Cl. ................. 381/71.12; 381/71.6; 381/71.13

(58) Field of Search ............................ 381/71.6, 71.11, 381/71.12, 71.8, 71.9, 71.13; 364/528.15; 708/322

(56) References Cited

U.S. PATENT DOCUMENTS 4,025,724 A * 5/1977 Davidson, Jr. et al. .. 381/71.13
5,337,366 A * 8/1994 Euguchi et al. .......... 381/71.11
5,452,361 A * 9/1995 Jones ...................... 381/71.11
5,481,615 A * 1/1996 Eatwell et al. ............. 381/71.6
5,613,009 A * 3/1997 Miyazaki et al. ........ 381/71.12
5,745,580 A * 4/1998 Southward et al. ...... 381/71.11
6,085,307 A * 4/2000 Evoy et al. ................... 712/31

* cited by examiner

*Primary Examiner*—Forester W. Isen
*Assistant Examiner*—Brian Tyrone Pendleton
(74) *Attorney, Agent, or Firm*—Oliff & Berridge, PLC

(57) ABSTRACT

A filtering device consisting of a nonadaptive feedback filter that generates active attenuation of the vibration on the framework, without generating instability in a first frequency band, and an adaptive feedforward filter is disclosed. Feedforward filtering coefficients are adapted in real time according to an algorithm chosen to minimize the energy of the types of vibration which are picked up by a sensing device as a function of the energy of the types of vibration which are picked up by the sensing device, and of the previously measured transfer function, in the presence of a feedback filtering device and in the absence of a feedforward filtering device, between an actuator device and a first sensing device. The device makes it possible to linearize the feedback attenuation throughout a second frequency band which is wider than the first frequency band, to accelerate the convergence of the minimization algorithm and to enhance the robustness of the feedforward filter.

18 Claims, 11 Drawing Sheets

METHOD AND DEVICE FOR HYBRID ACTIVE ATTENUATION OF VIBRATION, PARTICULARLY OF MECHANICAL, ACOUSTIC OR SIMILAR VIBRATION

The present invention relates to active attenuation of vibration, that is to say the operation which consists in attenuating certain types of vibration by superimposing other vibration created in phase opposition with the vibration to be attenuated.

It applies to the active attenuation of any vibration, and more particularly to acoustic, mechanical or similar vibration.

The technique of active attenuation by feedback is already known, based on a feedback loop configured to generate active attenuation on a framework which is subject to the vibration.

The feedback loop comprises an input linked to vibration sensor means known as the "near" means, which are arranged on the framework, and an output linked to vibration actuator means which are arranged on the framework, in proximity to the near sensor means. The signal measured by the near sensor means is injected directly into the actuator means via filtering means which correct said signal in order to attempt to cancel out its energy.

This feedback technique makes it possible to obtain vibration attenuation with a certain amount of gain, without generating instability in a band of processing frequencies. This processing band most often corresponds to low frequencies, for example, in terms of acoustic vibration, to the frequency band going from 0 to 600 Hz.

However, this feedback technique generates instability at high frequencies. It is therefore not totally satisfactory for obtaining vibration attenuation in a wide frequency band.

The technique of active feedforward attenuation is also known, in which reference vibration, upstream of the propagation of the vibration, and which are destined to propagate in the medium to be treated, are detected by sensor means known as "remote" means, then processed by filtering means so as to determine the command to be applied to the actuator means.

The feedforward technique is centered on adaptive-type filtering means with coefficients adapted in real time according to an algorithm chosen to minimize the energy of the vibration picked up by the near sensor means as a function of the energy of the reference vibration picked up by the remote sensor means.

Such a feedforward technique is generally satisfactory in dealing with vibration in a narrow frequency band. In contrast, when vibration has to be attenuated in a wide frequency band, lengthy and expensive adaptive filtering is generally required.

One solution for shortening the convergence time of the feedforward filtering algorithm is described in the MIYASAKI et al. document, 1994, "Consideration about Feed back, Feed forward, Hybrid Control for Active Control of Micro-Vibration", Second International Conference on Motion on Vibration Control, Yokohama, Aug. 30–Sep. 3, 1994. This consists in juxtaposing feedback-type active damping and feedforward filtering. The active feedback damping first of all applies damping of the vibration at a given frequency, generally the fundamental vibration frequency of the framework. Next, the feedforward filtering applies its attenuation to thus pre-damped vibration, which makes it possible to compress the impulse response of the actuator means/near sensor means secondary paths and thus shortens the processing of the feedforward filtering.

However, the active feedback damping is applied here at a single frequency, which renders this solution inappropriate and ineffective for an active treatment over a wide frequency band. This active damping is in fact equivalent to a passive damping since it treats only the fundamental frequency of the framework, which is completely different from wide-band active control by feedback filtering. Moreover, it is a question here of simple juxtaposition of feedforward filtering and of active damping in which no synergy of the techniques is introduced.

The present invention affords a solution to these problems.

It first of all envisages providing active attenuation of the vibration in a wide frequency band.

Another aim of the invention is to provide active attenuation of "hybrid" type in which feedforward filtering is grafted onto feedback filtering or vice versa, so as to enhance the respective behavior of said feedforward and feedback filtering with a resultant attenuation greater than the algebraic sum of the attenuation by said filtering types taken separately.

The present invention relates to an active vibration attenuation device of the type comprising:

- a framework likely to be subject to vibration to be attenuated;
- first vibration sensor means, arranged on the framework in a first predetermined geometric relationship with respect to said framework;
- vibration actuator means, arranged on the framework in proximity to the first sensor means; and
- filtering means comprising at least an input linked to the first sensor means and an output linked to the actuator means, the filtering means being configured to generate active attenuation of the vibration on the framework;
- second vibration sensor means, arranged on the framework in a second predetermined geometric relationship with respect to said framework;
- summation means possessing a first input, a second input, and an output linked to the actuator means.

According to a general definition of the invention, the filtering means comprise:

- nonadaptive-type feedback filtering means possessing an input linked to the first sensor means and an output linked to the first input of the summation means, and suitable for generating nonadaptive active attenuation of the vibration on the framework, without generating instability in a first frequency band;
- measurement means suitable for measuring, in advance, in the presence of the feedback filtering means, the transfer function between the actuator means and the first sensor means;
- adaptive-type feedforward filtering means comprising a first input linked to the second sensor means, a second input linked to the first sensor means, and an output linked to the second input of the summation means;

the filtering coefficients of the feedforward filtering means being adapted in real time according to an algorithm chosen to minimize the energy of the types of vibration which are picked up by the first sensor means as a function of the energy of the types of vibration which are picked up by the second sensor means, and of the previously measured transfer function;

which makes it possible to linearize the feedback attenuation throughout a second frequency band which is wider than the first frequency band, to accelerate the convergence of the minimization algorithm, and to enhance the robustness of the feedforward filtering means.

According to a first embodiment of the invention, the framework comprises at least one cavity bounded by an ear and passive attenuation means, the first sensor means and the actuator means being lodged in said cavity, while the second sensor means being arranged outside the cavity.

In another embodiment of the invention, the framework comprises a metal-type beam, a plate, a trellis, a seat, a ventilation duct or the like.

In practice, the first and second sensor means each comprise at least: a sound sensor element of microphone type, an acceleration sensor element of accelerometer type, a movement sensor element, a speed sensor element, a stress sensor element, a force sensor element or the like.

In one variant, the first sensor means comprise two sensor elements, one being associated with the feedforward filtering means, the other being associated with the feedback filtering means.

The actuator means preferably comprise a sound source of loudspeaker type, a test unit, a vibrating platform or the like.

The feedback filtering means advantageously comprise a plurality of active digital and/or analog filters of order greater than or equal to 1, configured to generate a transfer function making it possible to avoid instability in the first frequency band in the Nyquist sense, and the transfer function of the feedback filtering means is determined in such a way that the phase of said transfer function does not pass through the value 0 in the first frequency band.

In practice, the feedback filtering means are of the infinite impulse-response type.

For example, the feedforward filtering means are finite impulse-response filters, and the minimization algorithm is of the least mean squares type.

According to another aspect of the invention, the device comprises a plurality of first sensor means and of actuator means, and the device is centered around a structure with master/slave multiprocessors, each slave processor being tasked with driving a single actuator means.

A further subject of the present invention is a method of hybrid active attenuation of vibration, particularly of mechanical, acoustic or similar vibration, which is implemented by the device described above.

Other characteristics and advantages of the invention will emerge in the light of the detailed description below and of the attached drawings in which:

FIG. 1 is a diagrammatic representation of the active acoustic attenuation device according to the invention;

FIG. 2 diagrammatically represents the essential constituent means of the device of FIG. 1 according to the invention;

Figure 11:
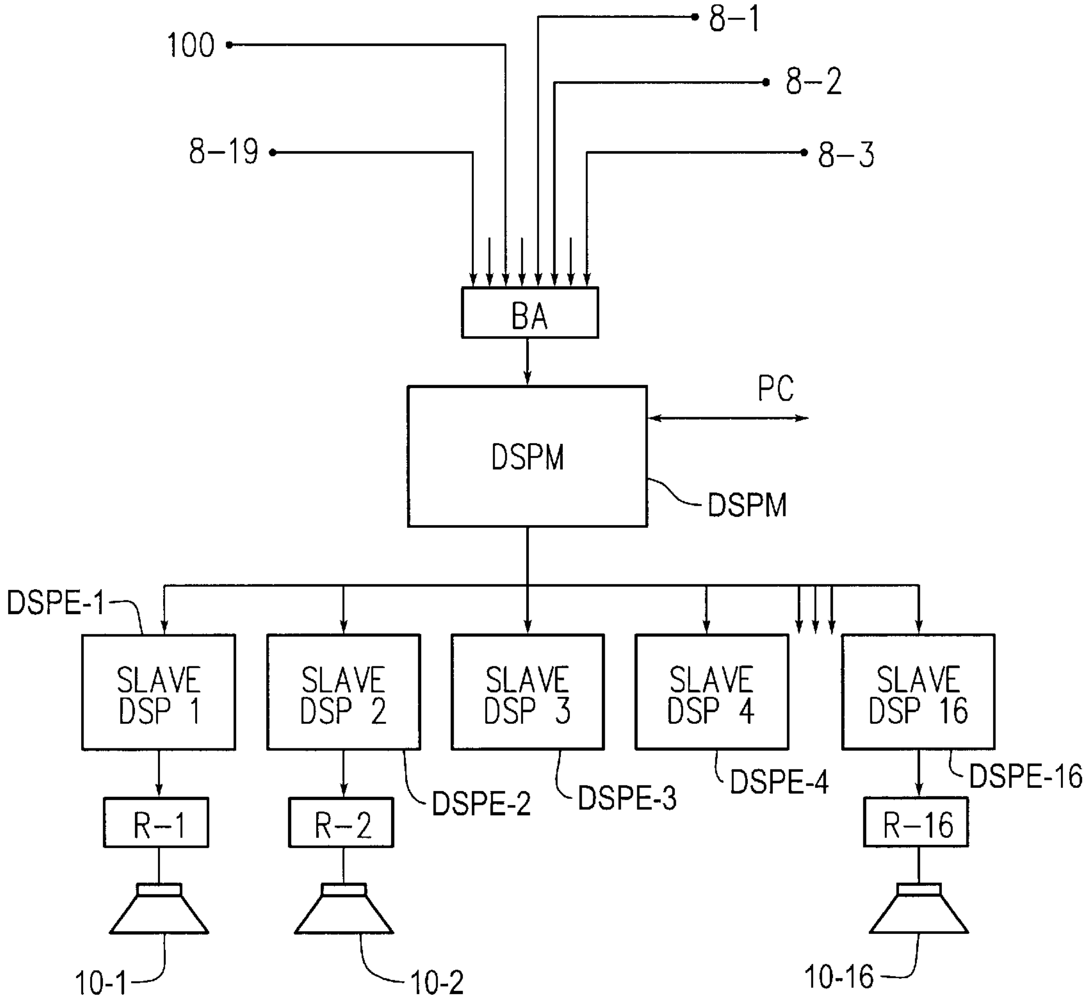
Figure 12:
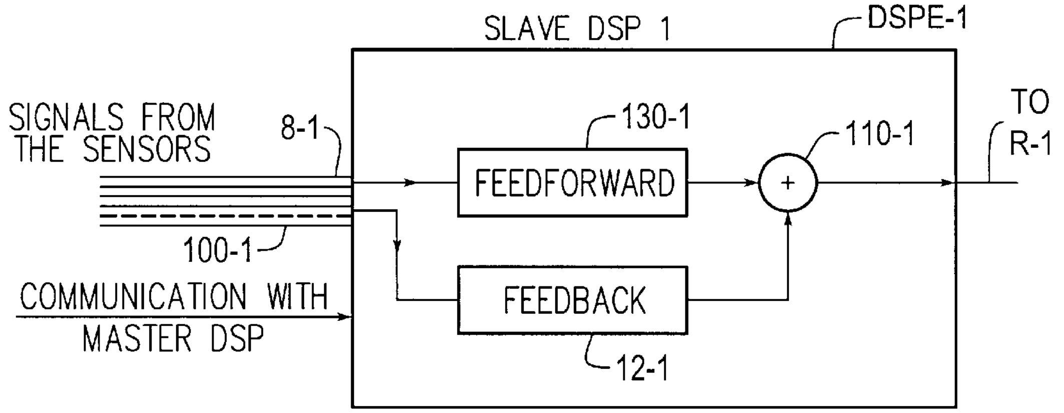
Figure 14:
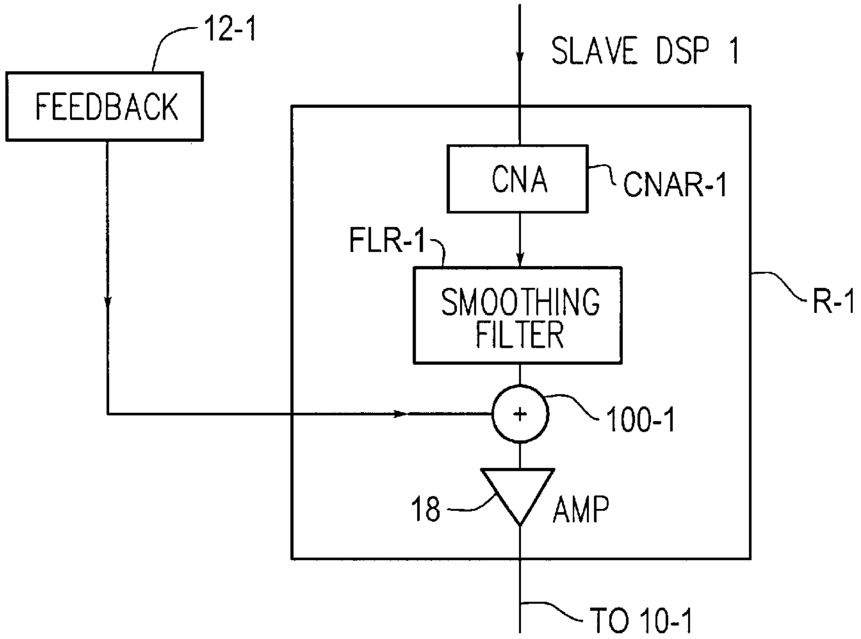
Figure 13:
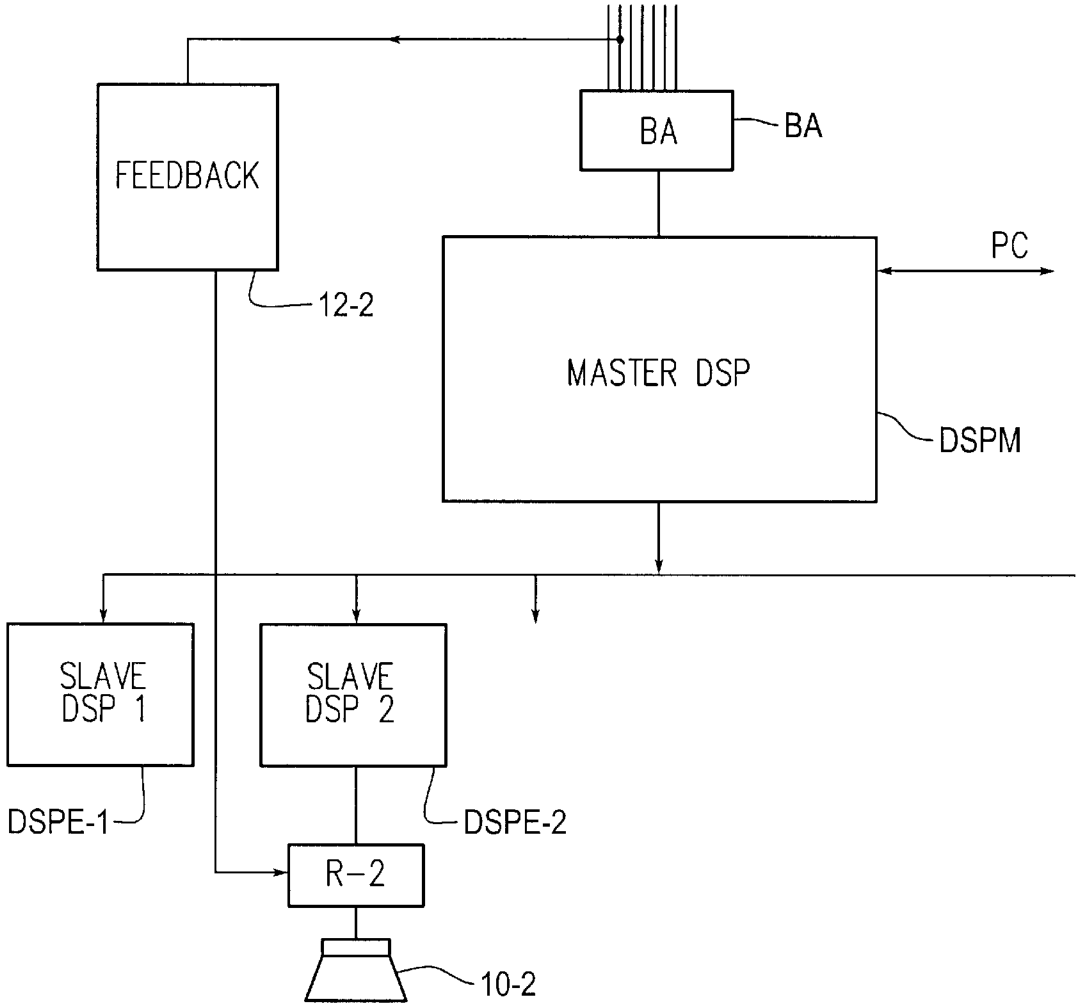

FIG. 11 diagrammatically represents the structure of the multichannel attenuation device according to the invention, in which the feedforward and feedback filtering operations are digital;

FIG. 12 diagrammatically represents the constituent elements of the slave processor of the device of FIG. 11;

FIG. 13 diagrammatically represents the structure of the multichannel attenuation device according to the intention, in which the feedback filtering is analog; and FIG. 14 diagrammatically represents the analog feedback filtering assembly in the device of FIG. 13.

Figure 1:
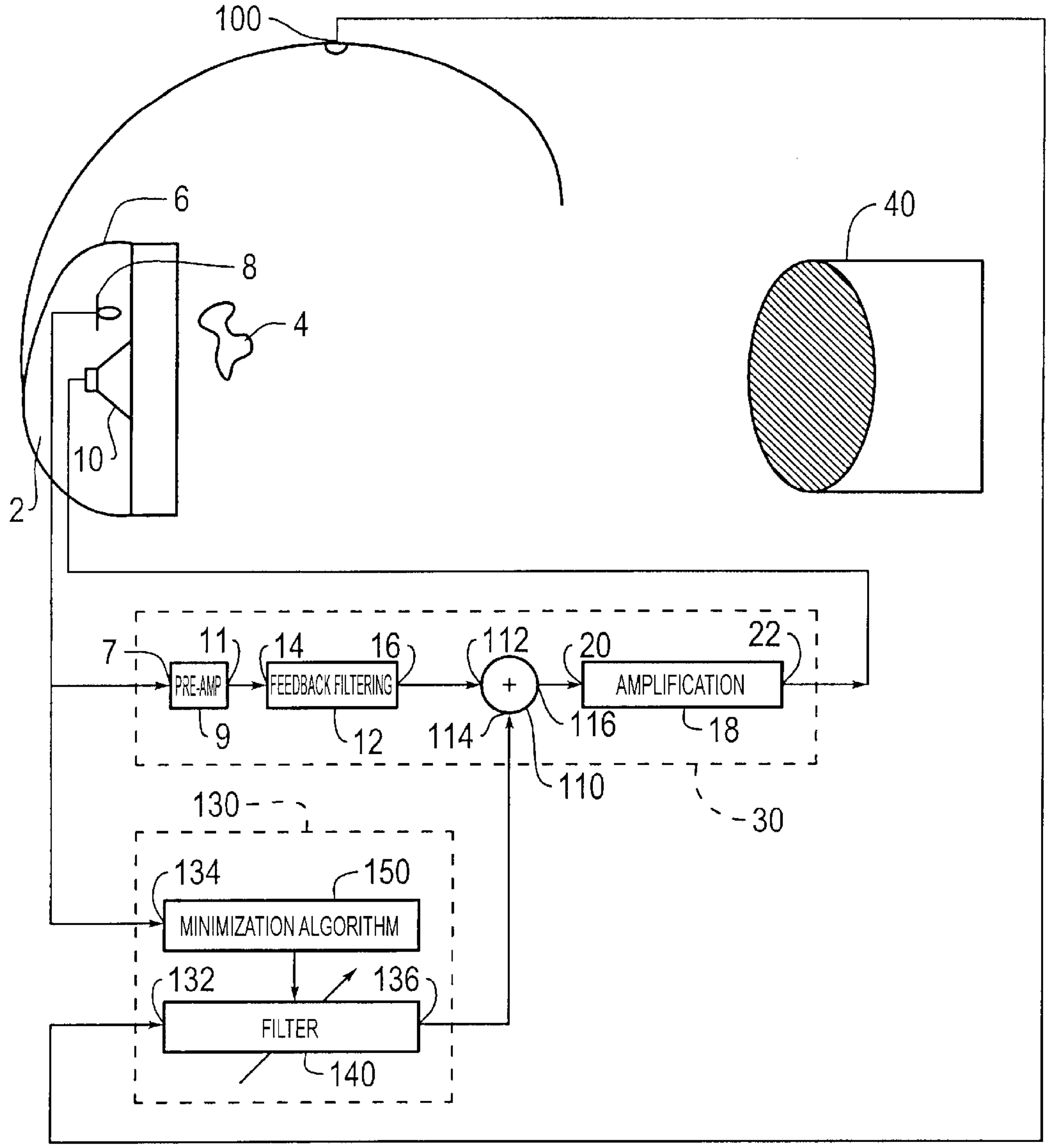

In FIG. 1, a particularly advantageous, non-limiting application of the invention has been represented, namely the attenuation of acoustic vibration In this application, the framework likely to be subject to vibration to be attenuated comprises a cavity 2 bounded by an ear 4 and attenuation means of helmet type 6.

The feedback-filter helmet is, for example, that sold by the TECHNOFIRST company.

In a known way, this helmet is equipped with an active feedback acoustic attenuation device.

In practice, this feedback attenuation device comprises, for each ear:

- a microphone 8 arranged in the cavity 2;
- a loudspeaker 10 arranged in the cavity 2 in proximity to the microphone 8;
- preamplification means 9 comprising an input 7 linked to the microphone 8 and an output 11;
- feedback filtering means 12 comprising an input 14 linked to the output 11, and an output 16; and
- amplification means 18 comprising an input 20 linked to the output 16, and an output 22 linked to the input of the loudspeaker 10.

The preamplification means 9, the feedback filtering means 12 and the amplification means 18 here constitute a feedback loop 30 arranged in a known way so as to generate active acoustic attenuation without generating instability in a chosen frequency band.

In FIG. 1, a noise source 40 capable of generating acoustic vibration for experimental and test purposes has been represented in proximity to the helmet.

For example the frequency band in which the feedback filtering means are effective, without generating instability in the Nyquist sense, is of the order of 0 to 600 Hz for acoustic vibration (FIG. 3), In practice, the feedback filtering means 12 comprise a plurality of active analog filters of order greater than or equal to 1, configured to generate a transfer function making it possible to avoid instability in the 0–600 Hz frequency band in the Nyquist sense, and the transfer function of the filtering means 12 is determined in such a way that the phase of said transfer function does not pass through the value 0 in the 0–600 Hz band.

Such feedback filtering is described in the French patent 86 03394, for example.

Figure 3:
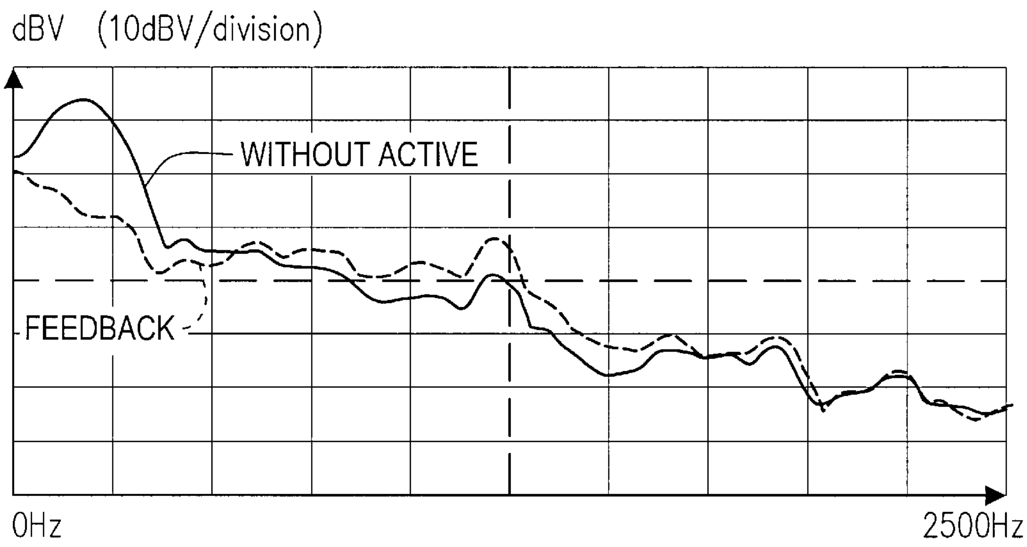
FIG. 3 are curves illustrating the attenuation of the acoustic vibration in the presence/absence of feedback filtering means, in a frequency band going from 0 to 2500 Hz.

With reference to FIG. 3, the helmet allows wideband processing up to 600 Hz and noise attenuation of the order of 20 dB. However, an effect of hunting appears above 650 Hz, which is translated into an increase in the level of noise by comparison with the action of the passive attenuation means alone. This phenomenon is completely familiar to the person skilled in the art, and constitutes a nonlinearity (performance degradation) by comparison with the results expected from observation of the system in open loop.

The Applicant Company has set itself the problem of remedying the drawbacks relating to feedback filtering.

The solution according to the invention consists, firstly, in using a supplementary microphone 100 arranged at a certain distance from the microphone 8. The supplementary microphone 100 is, for example, arranged on the upper part of the means which make it possible to fasten together the two shells of the helmet. Under these conditions, the supplementary microphone 100 is close to the source of noise 40 and thus makes it possible to recover useful information to be processed. Obviously, this remote microphone may be arranged differently.

Next, according to the invention, summation means 110 are provided within the feedback loop 30. These summation means 110 possess a first input 112 linked to the output 16 of the filtering means 12, a second input 114 and an output 116 linked to the input of the amplifier means 18.

Figure 4:
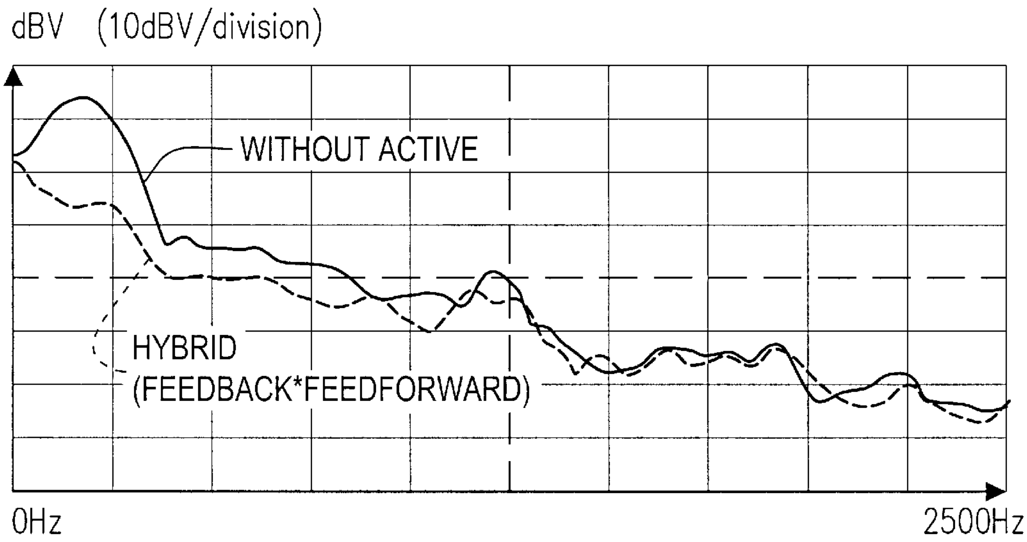
FIGS. 4 and 5 are curves illustrating the attenuation of the acoustic vibration in the presence/absence of hybrid filtering means according to the invention, in a frequency band going from 0 to 2500 Hz.
Figure 5:
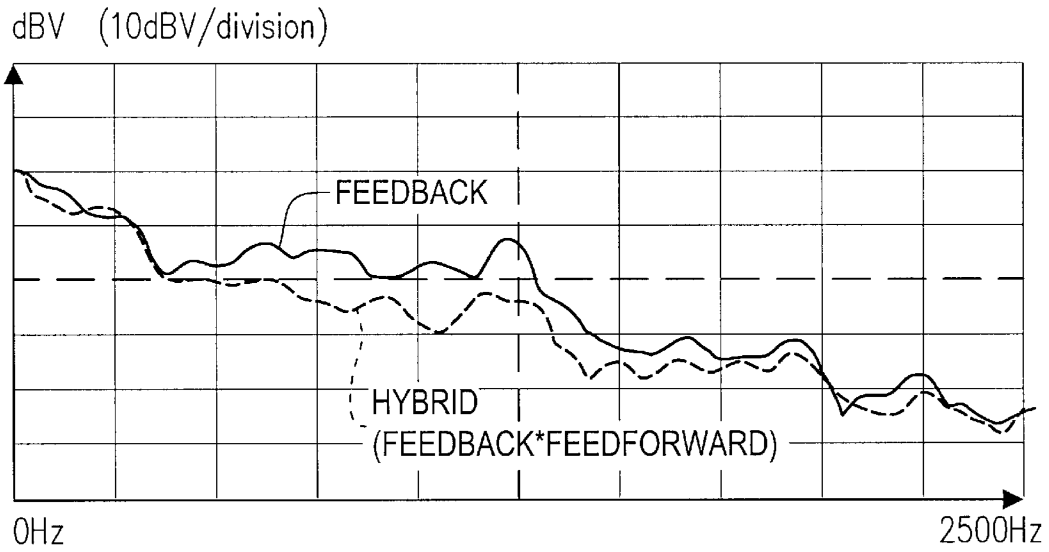

Finally, according to the invention, filtering means of feedforward type are grafted onto the feedback loop 30 in order to enhance the feedback filtering and, more precisely, in order to linearize the active attenuation throughout the whole of a frequency band wider than the 0–600 Hz band and thus to enhance the improvement in active attenuation in the widened band which may go as high as 3000 Hz, by complete suppression of the hunting effect mentioned above (FIG. 4).

In practice, the feedforward filtering means 130 comprise a first input 132 linked to the supplementary microphone 100, a second input 134 linked to the microphone 8 and an output 136 linked to the second input 114 of the summation means 110.

As will be seen in more detail later, the filtering coefficients of the feedforward filtering means 130 are adapted in real time according to an algorithm chosen to minimize the energy of the types of vibration which are picked up by the microphone 8, as a function of the energy of the types of vibration which are picked up by the microphone 100, in order to linearize the feedback attenuation throughout a second frequency band handled by the linearization which is wider than the first frequency band handled directly by feedback, to accelerate the convergence of the minimization algorithm, and to enhance the robustness of the feedforward filtering means.

In practice, the feedforward filtering means comprise adaptive-type finite impulse-response filters 140. The coefficients of the filters 140 are reupdated in real time by a minimization algorithm 150. The minimization algorithm is, for example, of the least mean squares type, also known as the LMS type.

This linearization can be observed at at least two points, particularly within the 0–600 Hz band in which the increase in attenuation in the band is enhanced; as well as within the 600–1100 Hz band in which the reappearance of the vibration relating to the hunting of the feedback filtering is suppressed, and in which attenuation appears although it does not exist in the presence of feedback filtering alone (FIGS. 3 to 8).

Figure 9:
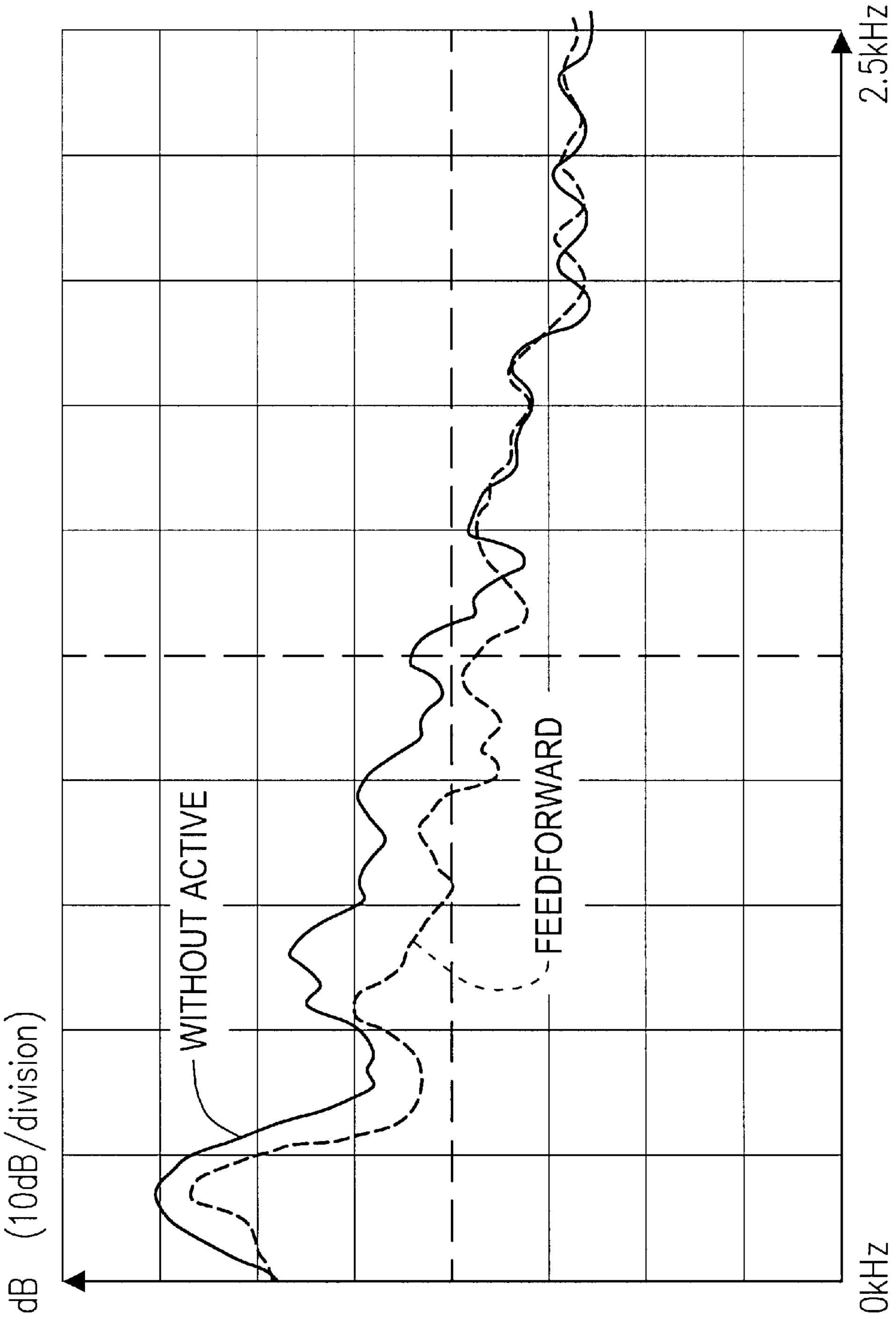
FIGS. 9, 10A and 10B are curves illustrating the attenuation of the acoustic vibration in the presence/absence of feedforward filtering.
Figure 10A:
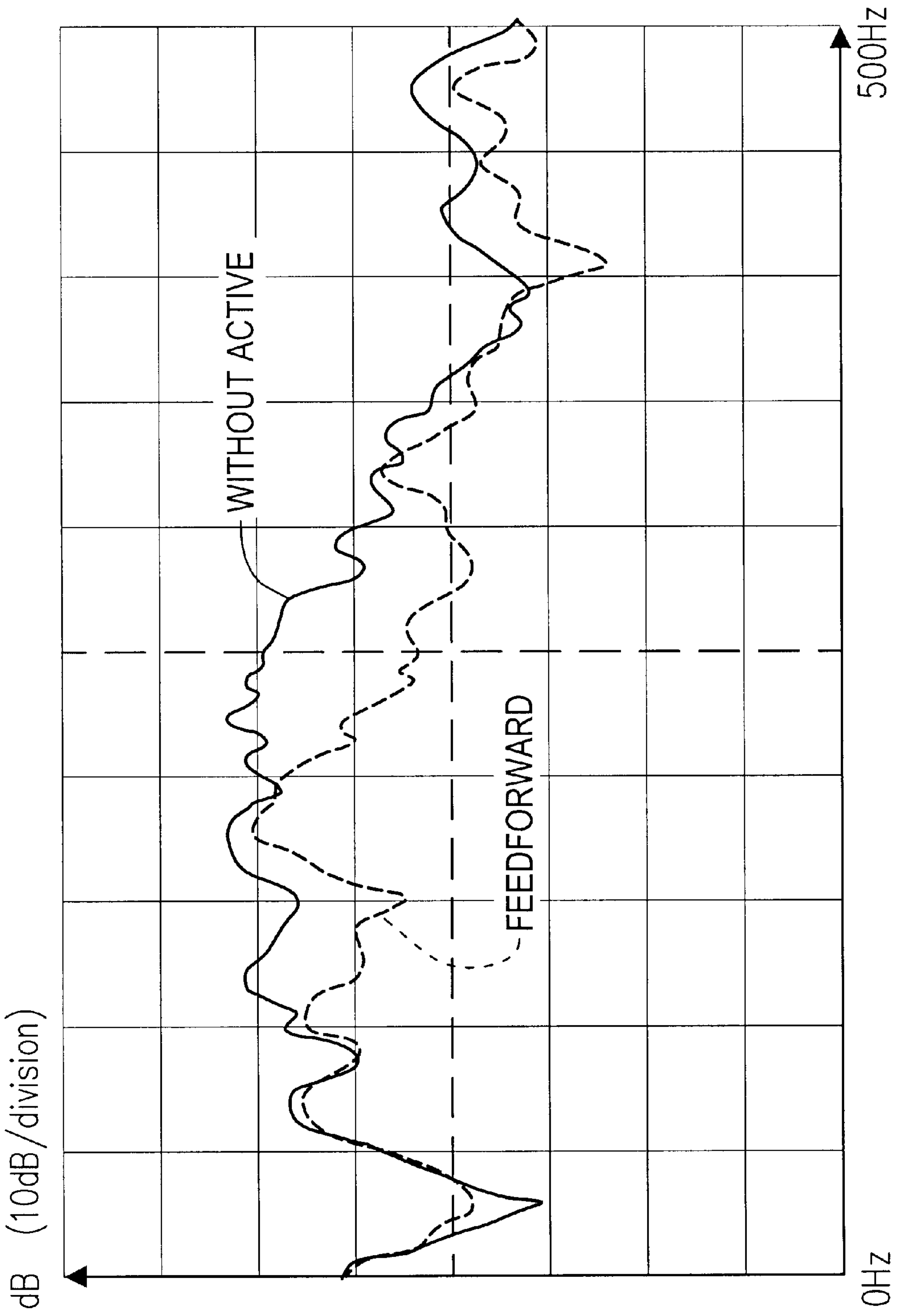
Figure 10B:
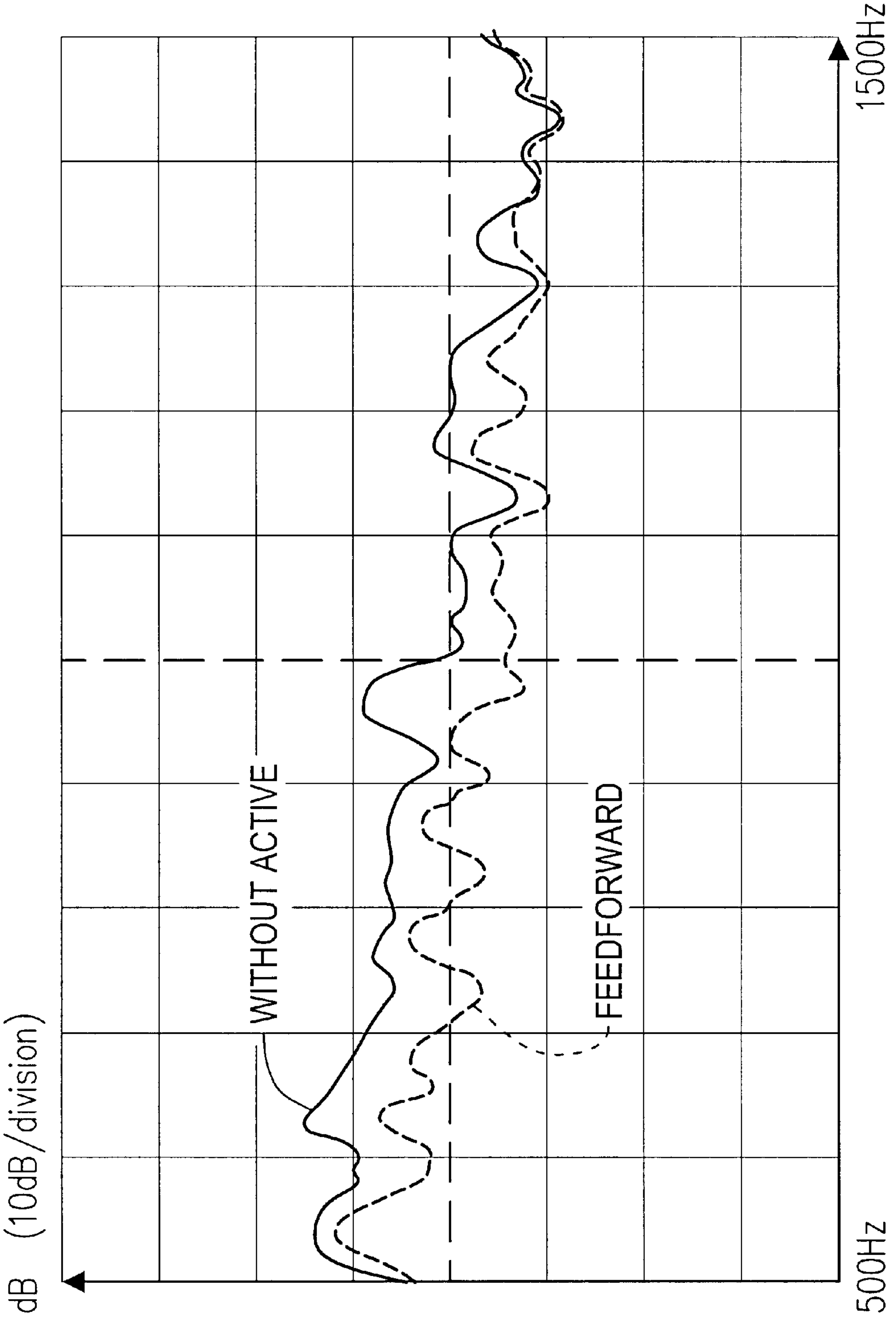

This acceleration of the convergence of the minimization algorithm, as well as the enhancement of the robustness of the feedforward filtering means, can be observed by comparing the attenuation curves obtained by the feedforward filtering means alone (FIGS. 9, 10A and 10B) with the attenuation curves obtained by the hybrid filtering means according to the invention (FIGS. 4 to 8).

It should be noted that the "hybrid"-type active attenuation obtained according to the invention results from a combination of the feedforward and feedback filtering means, in which the feedforward filtering is grafted onto the feedback filtering or vice versa.

This combination of the feedforward and feedback filtering according to the invention makes it possible to enhance the respective behavior of said filtering types, with a resultant active attenuation greater than the algebraic sum of the individual attenuations by said filtering types taken separately.

Figure 2:
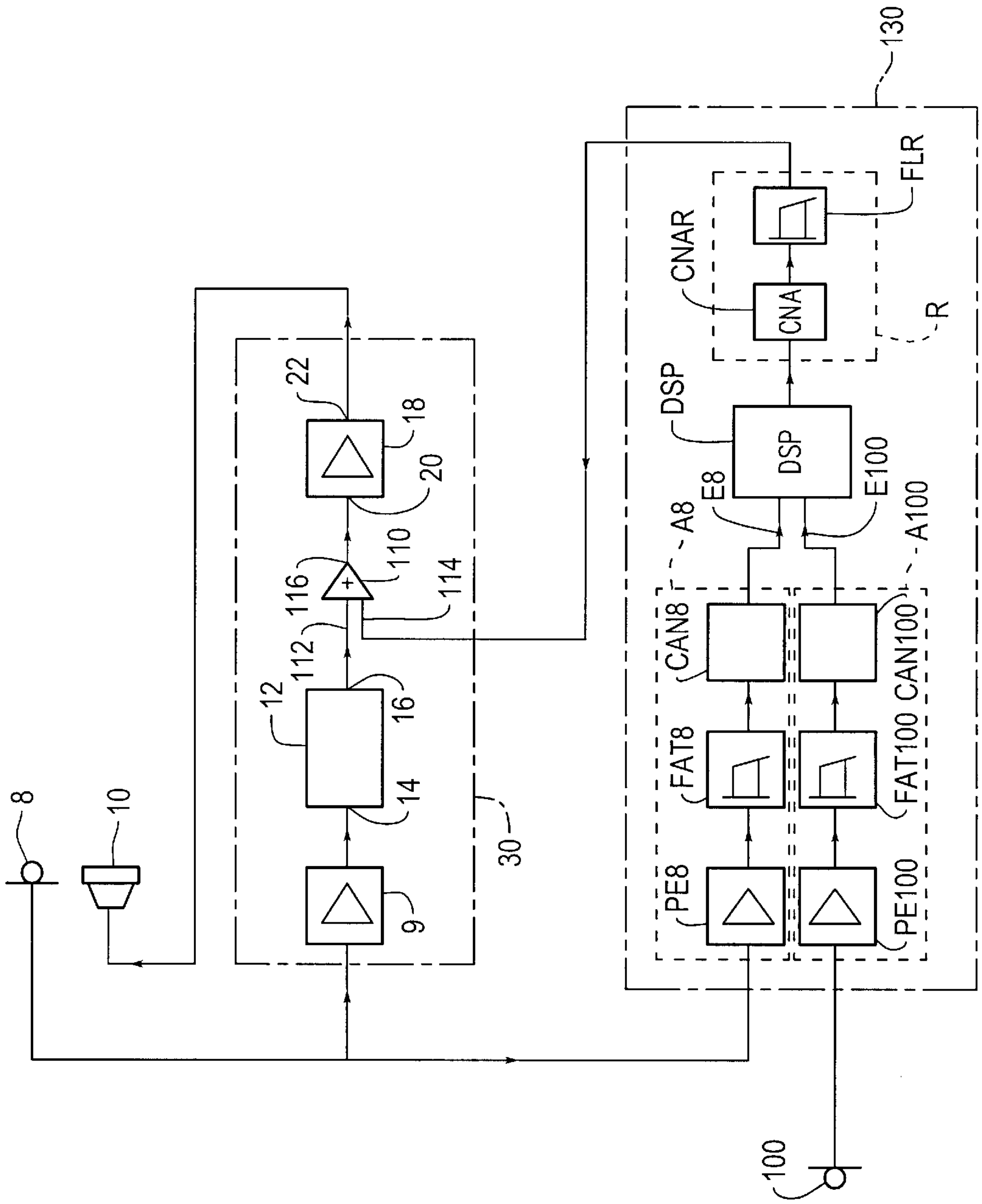

In FIG. 2, the constituent elements of the feedback filtering means have been represented in detail, as well as the constituent elements of the feedforward filtering means, the latter being combined with the feedback filtering means according to the invention.

The feedforward filtering means 130 comprise a first acquisition module A8 associated with the near sensor means 8 and a second acquisition module A100 associated with the remote sensor means 100.

The acquisition modules A8 and A100 are generally similar. However, in certain configurations, the acquisition modules may be different. Their constituent elements are individualized by the suffix 8 when they are associated with the sensor means 8 and 100 when they are associated with the remote sensor means 100.

Each acquisition module comprises:

- an input preamplifier element PE possessing an input linked to the associated sensor means 8 or 100, and an output;
- a conditioning filter FAT specific to the chosen application, preferably of the anti-overlap type possessing an input linked to the output of the input preamplifier and an output; and
- an analog/digital converter CAN possessing an input linked to the output of the conditioning filter and an output.

Each acquisition module is linked to processing means DSP which will particularly provide the minimization algorithm described above.

In practice, the digital processing means are of the digital signal processor DSP type.

The DSP processor comprises an input E8 receiving the signals leaving the acquisition module A8 and an input E100 receiving the signals leaving the acquisition module A100.

The DSP processor comprises an output delivering a digital signal intended for a reproduction module R.

This reproduction module R comprises a digital/analog converter CNAR and a smoothing filter FLR, of low-pass type, for example, the input of which receives the signal leaving the digital/analog converter CNAR and the output of which is linked to the second input 114 of the summation means 110.

The DSP processor is, for example, that sold by the TEXAS INSTRUMENT company under the reference TMS 320C25.

The operation of the device according to the invention is as follows.

In a first initialization stage, the feedback filtering means 12 are put into operation, as well as the noise source 40, while the feedforward filtering means are set to pause position.

The input preamplifiers PE8 and PE100 are set up on the feedforward filtering means so as to be at full scale of the analog/digital converters CANS and CAN100.

Next, the noise source 40 is turned off. The transfer function of the path, called secondary path, between the loudspeaker 10 and the microphone, called control microphone 8, is measured by an initialization method, for example by exciting the actuator means by filtered-reference, white noise, Diracs-type signals or the like.

Finally, the transfer function is sampled and saved in the memory of the DSP processor. For example, the transfer function is sampled at the frequency of 3000 Hz over a total of 80 points. Advantageously, the gain of the amplifier 18 is set so that the excitation of the loudspeaker 10 produces, at the output of the preamplifier PE8, a signal level close to that set up during the preceding stage relating to the dynamic setting-up of the converters.

This transfer function thus measured in advance will serve subsequently in the calibration phase for adapting the feedforward filtering elements.

Under operating conditions, that is to say during the minimization phase of the hybrid control device (hybrid meaning feedforward combined with feedback or vice versa), the digital processing means periodically, and in real time, acquire the remote noise picked up by the remote sensor means 100. They also calculate the energy of the signal, representative of the sum of the energies of the signals delivered by the near sensor means 8. Next, the feedforward filtering means 150 are set to search for optimal parameters for the best active attenuation. Knowledge of the impulse responses, measured previously from the signals output by the near and remote sensor means in real time, allows a chosen minimization algorithm to determine, in real time, the values of the active acoustic attenuation control signal.

The purpose of the convergence here is to minimize the energy of the signals delivered by the microphone 8 arranged in the cavity of the helmet where the noise is to be canceled out.

The minimization algorithm uses the least mean squares technique, for example, which is the most widespread in the field of real-time applications.

In a variant, the minimization algorithm may be a frequency-based algorithm working on Fourier transforms of the signals in question.

It should be noted that the impulse response or the transfer function of the loudspeaker/control microphone 8 paths here takes account of the feedback filtering.

Hence, the instability information related to the feedback filtering is introduced into the impulse response of the feedforward filter. Likewise, the wideband active attenuation information related to the feedback filtering appears in the sampled elements of the impulse response.

By virtue of the participation of this information thus related to the instability of the feedback filtering as well as the information related to the wideband active attenuation of this filtering, the feedforward filtering will contribute several types of enhancements, with reference to FIGS. 3 to 10B:

- cancellation of the amplification of signals at high frequency which is related to instability due to feedback;
- attenuation of the noise outside the processing band of the feedback filtering (improvement up to 10 dB by comparison with the passive processing by the shells in the case of the helmet);
- enhancement of the processing in the whole of the feedback filtering processing band (improvement up to 15 dB by comparison with feedback filtering alone), which allows it to be made yet more linear;
- enhancement of the robustness of the system, for example to Larsen effects;
- enhancement of performance by comparison with feedback filtering and feedforward filtering used separately;
- acceleration of the convergence of the minimization algorithm;
- enhancement of the robustness of the feedforward filtering means, (which can be observed by comparing the attenuation curves obtained by the feedforward filtering means alone (FIGS. 9, 10A and 10B) with the attenuation curves obtained by the hybrid filtering means according to the invention (FIGS. 4 to 8)).

It should be noted that the action of the feedforward filtering does not disturb that of the feedback filtering, in the sense that the minimization of the feedforward filtering in progress can be stopped without impairing the performance of the feedback filtering.

Figure 6:
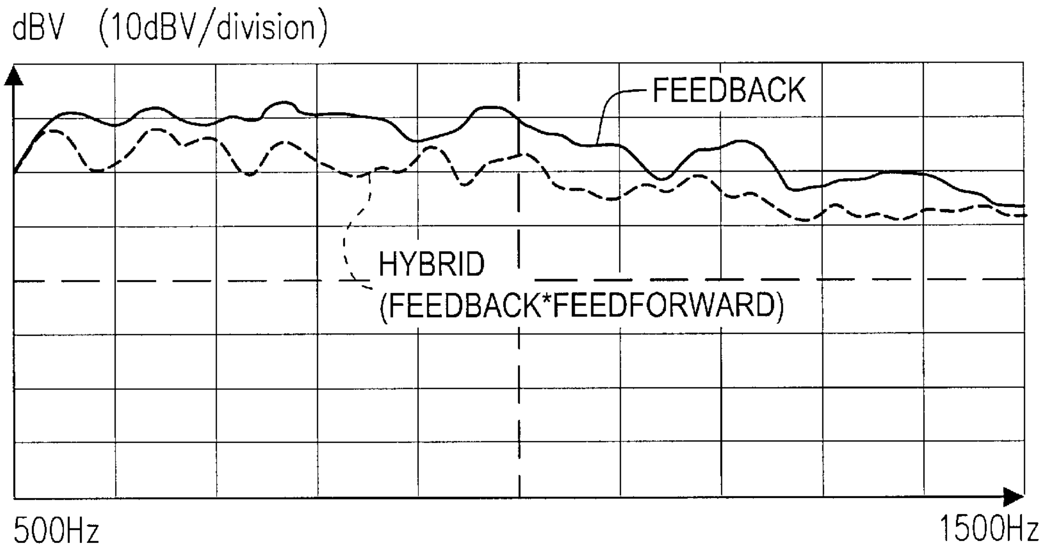
FIGS. 6 and 7 are curves illustrating the attenuation of the acoustic vibration in the presence/absence of hybrid filtering means according to the invention, in a frequency band going from 500 to 1500 Hz.
Figure 7:
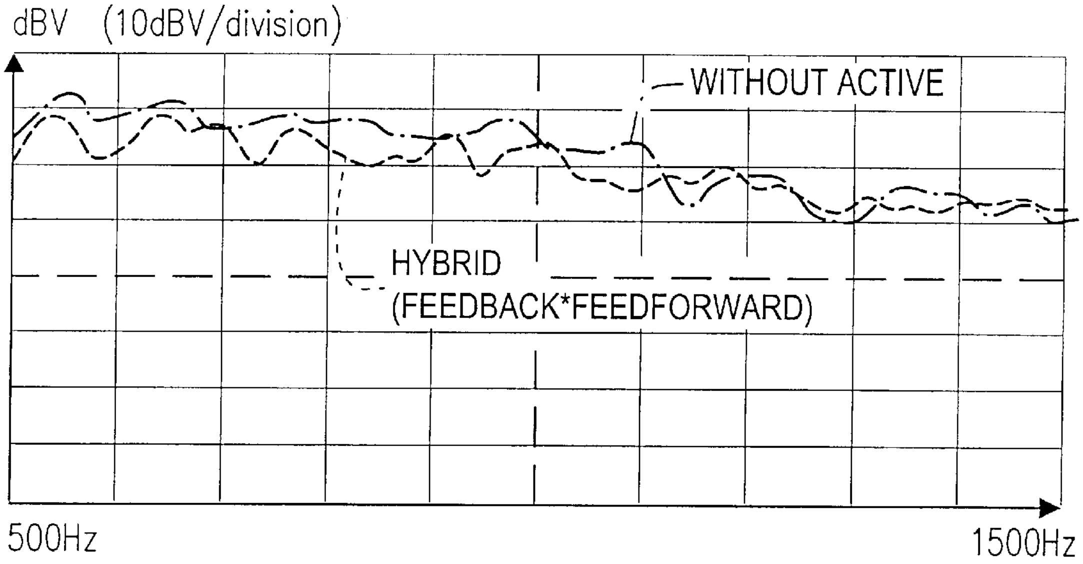
Figure 8:
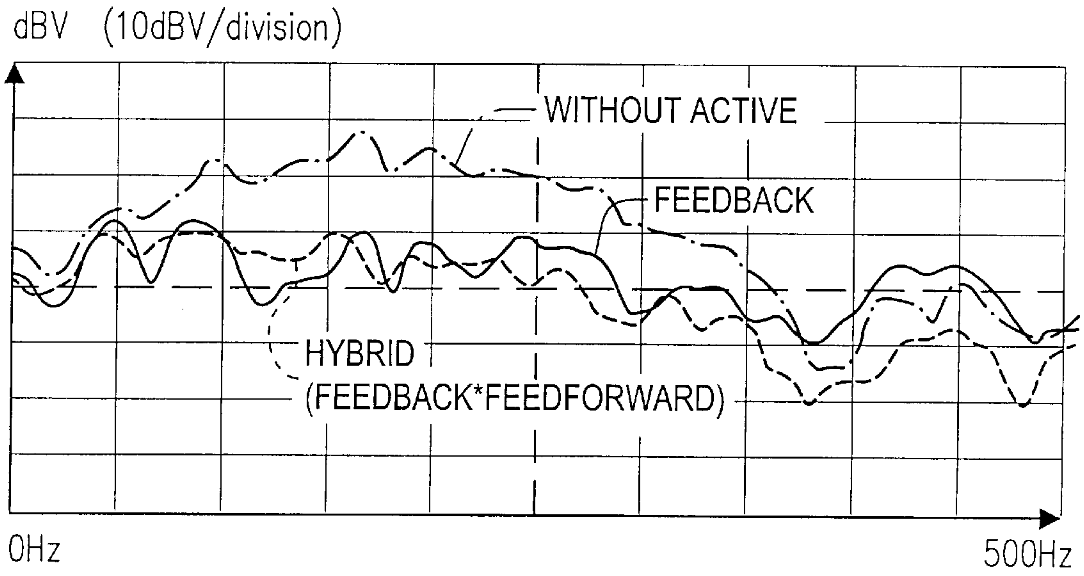
FIG. 8 is a curve illustrating the attenuation of the acoustic vibration in the presence/absence of hybrid filtering means according to the invention, in a frequency band going from 0 to 500 Hz.

The spectral power densities, measured using a microphone fixed into the ear of the experimenter in various configurations, have been represented in FIGS. 3 to 10B. The undesirable effects due to instability of the feedback filtering (rejection up to 8 dB) are eliminated by the action of the feedforward filtering device (see FIGS. 3, 4 and 5) Better still, the feedforward device makes it possible, outside the processing band of the feedback (0–600 Hz) , to obtain an increase in attenuation from 2 to 10 dB by comparison with a passive helmet (FIG. 6).

Likewise, better anti-noise results have been measured at low frequencies, up to +15 dB.

The device described by reference to FIGS. 1 and 2 uses processing of single-channel type, centered around the TMS 320C25 processor from TEXAS INSTRUMENTS, which can execute 10 million instructions per second.

However, it may be too slow, since it has to drive a multichannel device comprising a plurality of sensors 8, of remote sensors 100 and of actuators 10.

For example, for operation of the device with five microphones 8, five loudspeakers 10, 60 points for the impulse responses and 15 feedforward filtering coefficients, the processor can work only at sampling frequencies less than or equal to 1000 Hz.

However, certain experiments require fast processing, for a number of microphones 8 called error microphones and of counter-noise sources 10 greater than five.

Moreover, to preserve the full effectiveness of the minimization algorithm, it may be necessary to have a good knowledge of the impulse response of the secondary paths. It is therefore necessary to record this response in memory with a large number of points. This number of points also determines the number of samples of the reference signal originating from the remote sensor 100 which it is also necessary to keep in internal memory, giving the problem of memory capacity.

The present invention also affords a solution to these problems.

According to the invention, the attenuation device is capable of managing a plurality of channels, for example twenty analog input channels capable of receiving the signals emanating from 19 near sensors individually identified as 8-1 to 8-19 and from a remote sensor 100. The device according to the invention also comprises at least sixteen output channels capable of transporting signals to sixteen actuators individually identified as 10-1 to 10-16.

Such a structure implies the processing of I (integer number of error sensors 8) times J (integer number of actuators) impulse responses, one response RIJ for each combination of actuators J and of error sensors I.

Very advantageously, the device is centered around a structure with master/slave multiprocessors, each slave processor being tasked with driving a single actuator means.

With reference to FIG. 11, the master processor DSPM handles acquisition of all the signals emanating from the sensors 8 and 100, particularly the reference signals, called remote signals, as well as the control signals called error signals. It then distributes them to all the slave processors DSPE, individually identified here as DSPE-1 to DSPE-16.

Each slave processor DSPE calculates the output signal of a single actuator 10.

In practice, the sensors 8 and the remote sensor 100 are linked to the inputs of an acquisition unit BA, the output of which is linked to the master processor DSPM.

This acquisition unit BA comprises, like the acquisition modules A described with reference to FIG. 2, a preamplifier element PE, a conditioning filter FAT preferably specific to the chosen application, and an analog/digital converter CAN.

The conditioning filter may be digital (anti-overlap) or else analog (specific).

A PC-type microcomputer may be provided. In this case, it is linked to the master processor and is equipped with all the software for driving the installation as a whole.

The digital assembly is centered around a digital signal processor DSP element, for example the one sold by the TEXAS INSTRUMENT company under the reference TMS 320C50.

With reference to FIG. 12, each slave processor is dedicated to the control of a single actuator. As an example, take the case of the processor associated with actuator 10-1, which is connected with all the microphones 8 as well as with the remote microphone 100.

All the signals from the sensors 8 and 100 are routed via the acquisition unit BA and the master processor DSPM to the slave processor DSPE-1.

The slave processor DSPE generally comprises the same elements as those of the single-channel device described with reference to FIG. 2. Hence, the reproduction means R, the feedback filtering means 12, as well as the feedforward filtering means 130 are again present. A summation element 110 receives, on its two inputs, the signals emanating from the two types of filtering, so as to deliver, at its output, the attenuation signal intended for the actuator 10-1.

The slave processor comprises communications with the master processor DSPM.

In the case of analog-type feedback filtering (FIG. 14), modifications are applied within the reproduction unit. An individual summation 100-1, that is to say one associated with the slave processor DSPE-1, makes it possible to add the analog signal arising from the feedback filtering 12-1 to the analog signal arising from the specific filtering FLR-1.

It should be noted that the feedback filtering has meaning only for a pair of transducers comprising an actuator and a sound sensor. Under these conditions, the number of digital or analog feedback filtering operations is equal to:

either to the number of sensors B, when this number is equal to the number of actuators 10, or to the number of actuators 10, if this number is less than the number of sensors 8, or to the number of sensors 8, if this is less than the number of actuators 10.

Thus the maximum number of feedback filtering operations is defined.

The notion of pairs of transducers 8 and 10 is also defined, that is to say the processing channels on which the respective feedback filtering means are applied.

Next, each slave processor DSPE, in parallel with the feedforward filtering, calculates the feedback filtering which is associated with it, in the case of digital-type feedback filtering.

In the case of analog-type feedback filtering (FIG. 12), a network of connections is provided, into which the feedback filtering modules are plugged between the chosen pairs of transducers 8, 10.

In the foregoing description, we have described an application related to acoustic vibration. However, the invention applies to the active attenuation of any vibration.

Thus, the framework subject to vibration may also be a metal-type beam, a plate, a trellis, a seat, a ventilation duct or the like. Under these conditions, the sensor means may be sound sensor means, but also acceleration, stress, force, movement and speed sensor means or the like. Likewise, the actuator means may be not only a sound actuator such as a loudspeaker, but also a test unit, a piezoelectric element or the like Moreover, the near sensor means may comprise two sensor elements, one being associated with the feedforward filtering means, the other being associated with the feedback filtering means.

What is claimed is:

1. Active vibration attenuation device of the type comprising:

a framework subject to vibration to be attenuated:

first vibration sensor means, arranged on the framework in a first predetermined geometric relationship with respect to said framework;

vibration actuator means, arranged on the framework in proximity to the first sensor means; and filtering means comprising at least an input linked to the first sensor means and an output linked to the actuator means, the filtering means being configured to generate active attenuation of the vibration on the framework;

second vibration sensor means, arranged on the framework in a second predetermined geometric relationship with respect to said framework; and summation means possessing a first input, a second input, and an output linked to the actuator means;

the filtering means comprising:

nonadaptive-type feedback filtering means possessing an input linked to the first sensor means and an output linked to the first input of the summation means, and suitable for generating nonadaptive active attenuation of the vibration on the framework, without generating instability in a first frequency band;

means for measuring, in advance of operating the device in a hybrid active vibration attenuation mode, in the presence of the feedback filtering means, the transfer function between the actuator means and the first sensor means;

adaptive-type feedforward filtering means comprising a first input linked to the second sensor means, a second input linked to the first sensor means, and an output linked to the second input of the summation means;

the filtering coefficients of the feedforward filtering means being adapted in real time according to an algorithm chosen to minimize the energy of the types of vibration which are picked up by the first sensor means as a function of the energy of the types of vibration which are picked up by the second sensor means, and of the thus previously measured transfer function measured in advance of operating the device in a hybrid active vibration attenuation mode, which makes it possible to linearize the feedback attenuation throughout a second frequency band, to accelerate the convergence of the minimization algorithm, and to enhance the robustness of the feedforward filtering means.

2. Device according to claim 1, the framework comprising at least one cavity bounded by an ear and passive attenuation means, the first sensor means and the actuator means being lodged in said cavity, while the second sensor means being arranged outside the cavity.

3. Device according to claim 1, the framework comprising one of at least a metal-type beam, a plate, a trellis, a seat, and a ventilation duct.

4. Device according to claim 1, the first sensor means comprising one of at least: a sound sensor element of microphone type, an acceleration sensor element of accelerometer type, a movement sensor element, a speed sensor element, a stress sensor element, and a force sensor element.

5. Device according to claim 4, the first sensor means comprising two sensor elements associated with at least one of the feedforward filtering means and the feedback filtering means.

6. Device according to claim 1, the second sensor means comprising one of at least: a sound sensor element of microphone type, an acceleration sensor element of accelerometer type, a movement sensor element, a speed sensor element, a stress sensor element, and a force sensor element.

7. Device according to claim 1, the actuator means comprising one of at least a sound source of loudspeaker type, a test unit, and a vibrating platform.

8. Device according to claim 1, the feedback filtering means comprising one of a plurality of active digital and/or analog filters of order greater than or equal to 1, configured to generate a transfer function to avoid instability in the first frequency band in the Nyquist sense, and in that the transfer function of the feedback filtering means is determined in such a way that the phase of said transfer function does not pass through the value zero in the first band.

9. Device according to claim 1, the feedback filtering means being of the infinite impulse-response type.

10. Device according to claim 1, the feedforward filtering means comprising:

a first acquisition module possessing an input linked to the output of the first sensor means, and an output:

a second acquisition module possessing an input linked to the output of the second sensor means, and an output;

digital processing means possessing a first input linked to the output of the first acquisition module, a second input linked to the output of the second acquisition module, and an output, said digital processing means being suitable for controlling the algorithm for minimizing the energy of the types of vibration which are picked up by the first sensor means as a function of the energy of the types of vibration which are picked up by the second sensor means; and a reproduction module possessing an input linked to the output of the digital processing means and an output linked to the second input of the summation means.

11. Device according to claim 10, the first and second acquisition modules comprising:

an input preamplifier element possessing an input receiving the signals output by the first sensor means or by the second sensor means, and an output;

a conditioning filter adapted to the chosen application and possessing an input linked to the output of the input preamplifier element and an output; and an analog/digital converter possessing an input linked to the output of the conditioning filter and an output linked to an input of the digital processing means.

12. Device according to claim 10, the reproduction module comprising:

a digital/analog converter possessing an input linked to the output of the digital processing means and an output; and a smoothing filter possessing an input linked to the output of the digital/analog converter and an output linked to the second input of the summation means.

13. Device according to claim 10, the feedforward filtering means being finite impulse-response filters and in that the minimization algorithm is of the least mean squares type.

14. Device according to claim 10, the digital processing means being of the digital signal processor type.

15. Device according to claim 1, further comprising a plurality of first sensor means, and actuator means, the device being centered around a structure with master/slave multiprocessors, each slave processor being tasked with driving a single actuator means.

16. Method of active vibration attenuation, particularly of acoustic vibration, of the type comprising the following stages:

a) providing a framework subject to vibration to be attenuated;

b) providing first vibration sensor means, arranged on the framework in a first predetermined geometric relationship with respect to said framework;

c) providing vibration actuator means, arranged on the framework in proximity to the first sensor means;

d) providing filtering means comprising at least an input linked to the first sensor means and an output;

e) configuring the filtering means so as to generate active attenuation of the vibration on the framework;

f) providing second vibration sensor means, arranged on the framework in a second predetermined relationship;

g) Providing summation means possessing a first input, a second input, and an output linked to the actuator means;

characterized in that it further comprises the following stages:

h) providing nonadaptive-type feedback filtering means possessing an input linked to the first sensor means and an output linked to the first input of the summation means, and configuring the said feedback filtering means so as to generate nonadaptive-type active attenuation of the vibration on the framework, without generating instability in a first frequency band;

i) measuring, in advance of operating the device in a hybrid active vibration attenuation mode;

and in the presence of the feedback filtering means, the transfer function between the actuator means and the first sensor means;

j) providing nonadaptive-type feedforward filtering means comprising a first input linked to the second sensor means, a second input linked to the first sensor means, and an output linked to the second input of the summation mean;

k) adapting the filtering coefficients of the feedforward filtering means in real time according to an algorithm chosen to minimize the energy of the types of vibration which are picked up by the first sensor means as a function of the energy of the types of vibration which are picked up by the second sensor means, and the previously measured transfer function measured in advance of operating the device in a hybrid active vibration attenuation mode;

which makes it possible to linearize the feedback attenuation throughout a second frequency band which is wider than the first frequency band, to accelerate the convergence of the minimization algorithm, and to enhance the robustness of the feedforward filtering means.

17. Active vibration attenuation device of the type comprising:

a framework subject to vibration to be attenuated:

first vibration sensor means, arranged on the framework in a first predetermined geometric relationship with respect to said framework;

vibration actuator means, arranged on the framework in proximity to the first sensor means; and filtering means comprising at least an input linked to the first sensor means and an output linked to the actuator means, the filtering means being configured to generate active attenuation of the vibration on the framework;

second vibration sensor means, arranged on the framework in a second predetermined geometric relationship with respect to said framework; and summation means possessing a first input, a second input, and an output linked to the actuator means;

the filtering means comprising:

nonadaptive-type feedback filtering means possessing an input linked to the first sensor means and an output linked to the first input of the summation means, and suitable for generating nonadaptive active attenuation of the vibration on the framework, without generating instability in a first frequency band;

means for measuring, in advance of operating the device in a hybrid active vibration attenuation mode, in the presence of the feedback filtering means, the transfer function between the actuator means and the first sensor means;

adaptive-type feedforward filtering means comprising a first input linked to the second sensor means, a second input linked to the first sensor means, and an output linked to the second input of the summation means;

the filtering coefficients of the feedforward filtering means being adapted in real time according to an algorithm chosen to minimize the energy of the types of vibration which are picked up by the first sensor means as a function of the energy of the types of vibration which are picked up by the second sensor means, and of the thus previously measured transfer function measured in advance of operating the device in a hybrid active vibration attenuation mode, which makes it possible to linearize the feedback attenuation throughout a second frequency band, to accelerate the convergence of the minimization algorithm, and to enhance the robustness of the feedforward filtering means; and wherein the first frequency band is from about 0 Hz to about 600 Hz and the second frequency band is from about 0 Hz to about 1500 Hz.

18. Method of active vibration attenuation, particularly of acoustic vibration, of the type comprising the following stages:

a) providing a framework subject to vibration to be attenuated;

b) providing first vibration sensor means, arranged on the framework in a first predetermined geometric relationship with respect to said framework;

c) providing vibration actuator means, arranged on the framework in proximity to the first sensor means;

d) providing filtering means comprising at least an input linked to the first sensor means and an output;

e) configuring the filtering means so as to generate active attenuation of the vibration on the framework;

f) providing second vibration sensor means, arranged on the framework in a second predetermined relationship;

g) Providing summation means possessing a first input, a second input, and an output linked to the actuator means;

characterized in that it further comprises the following stages:

h) providing nonadaptive-type feedback filtering means possessing an input linked to the first sensor means and an output linked to the first input of the summation means, and configuring the said feedback filtering means so as to generate nonadaptive-type active attenuation of the vibration on the framework, without generating instability in a first frequency band;

i) measuring, in advance of operating the device in a hybrid active vibration attenuation mode and in the presence of the feedback filtering means, the transfer function between the actuator means and the first sensor means;

j) providing nonadaptive-type feedforward filtering means comprising a first input linked to the second sensor means, a second input linked to the first sensor means, and an output linked to the second input of the summation means;

k) adapting the filtering coefficients of the feedforward filtering means in real time according to an algorithm chosen to minimize the energy of the types of vibration which are picked up by the first sensor means as a function of the energy of the types of vibration which are picked up by the second sensor means, and the previously measured transfer function measured in advance of operating the device in a hybrid active vibration attenuation mode; and pre-amplifying a signal from the first vibration sensor means and inputting the amplified signal to the nonadaptive-type feedback filtering means;

which makes it possible to linearize the feedback attenuation throughout a second frequency band which is wider than the first frequency band, to accelerate the convergence of the minimization algorithm, and to enhance the robustness of the feedforward filtering means; and wherein the first frequency band is from about 0 Hz to about 600 Hz and the second frequency band is from about 0 Hz to about 1500 Hz.

* * * * *